US000001868H

United States Statutory Invention Registration [19]

[11] Reg. Number: H1,868

Robson

[45] Published: Oct. 3, 2000

[54] METHOD OF AND APPARATUS FOR CONTROLLING PLASMA POTENTIAL AND ELIMINATING UNIPOLAR ARCS IN PLASMA CHAMBERS

[75] Inventor: Anthony E. Robson, Alexandria, Va.

[73] Assignee: United States of America, Washington, D.C.

[21] Appl. No.: 09/060,056

[22] Filed: Apr. 15, 1998

[51] Int. Cl.[7] ..... C23C 16/00

[52] U.S. Cl. ..... 118/723 I

*Primary Examiner*—Harold J. Tudor

*Attorney, Agent, or Firm*—Thomas E. McDonnell; Chester L. Jordan

[57] ABSTRACT

A method of and apparatus for controlling the potential of a plasma including a metal-walled chamber and a conductive coil which carries a radio-frequency current and is wrapped around the metal-walled chamber to produce a plasma within the chamber. A filament made of refractory metal has two ends, and a central portion formed in the shape of a probe. The central portion of the filament extends into the interior of the chamber and the two ends of the filament pass through a wall of the chamber to the exterior of the chamber. A heating power supply is connected to the two ends to the filament and to the chamber wall for heating the filament to a predetermined temperature above that of the plasma. The heated filament produces thermionic emissions from the filament to the plasma in order to control the plasma potential and eliminate unipolar arcing at the chamber wall.

1 Claim, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF AND APPARATUS FOR CONTROLLING PLASMA POTENTIAL AND ELIMINATING UNIPOLAR ARCS IN PLASMA CHAMBERS

FIELD OF INVENTION

The present invention relates to a CVD coating apparatus, and more particularly to a CVD (chemical vapor deposition) coating apparatus and method using a metal-walled plasma chamber.

BACKGROUND

When a conductor loop or coil carrying radio frequency current is wrapped around a dielectric chamber containing gas at low pressure, a plasma is formed inside the chamber as a result of currents induced by the changing magnetic field of the coil known as inductive coupling. Plasmas may be produced inside metal-walled chambers, if the chambers are suitable for high power CVD diamond reactors, which is the subject of a recent patent application U.S. Ser. No. 08/483,982, to A. E. Robson, et al, for a *Durable Plasma Treatment apparatus and Method.*

Although the primary advantage of metal chambers is to allow much grater power to be dissipated in the plasma than is possible in dielectric chambers, there is a secondary advantage to slotted metal chambers: the chamber acts as a Faraday cage and prevents capacitive coupling between the coil and the plasma. As is well known, capacitive coupling can lead to significant potentials arising between the coil and the plasma. As is well known, capacitive coupling can lead to significant potentials arising between the plasma and the wall of a dielectric chamber, and the resulting acceleration of plasma ions toward the walls can be deleterious to many processes.

In the case of metal walled chambers, the maximum potential between the plasma and the wall is limited to the "floating potential," $V_f$, given by $$V_f = \frac{kT_e}{2e}\ln\left(\frac{m_i}{2\pi m_e}\right)$$

where $T_e$, is the electron temperature, $m_i$ is the ion mass and $m_e$ is the electron mass. For a hydrogen plasma at a typical temperature of 2eV, $V_f \approx 5.7$V; in a water plasma, where the principal ion is $H_3O^+$, $V_f \approx 8.6$ V. Ions accelerated to the walls by these potentials will have little or no deleterious effect on the deposition process. On the other hand, these potentials are sufficient to sustain unipolar arcs on the chamber walls and these can be highly deleterious to any process because they introduce significant quantities of wall material into the plasma. There appears to be evidence that unipolar arcs are occurring in the 3M2 reactor.

Unipolar arcs can occur in metal chambers whenever $V_f > V_c$, where $V_c$ is the cathode fall of an arc. $V_c$ depends on the cathode material and is in the range 7–12 V. Further details may be had by reference to the paper by A. D. Robson and P. C. Thonemeann, entitled "*An Arc Maintained on an Isolated Metal Plate Exposed to a Plasma*," Proc. Phys. Soc. (London) 73, 508, (1959), which is incorporated herein by reference. Ways of eliminating unipolar arcs are discussed in the paper by A. E. Robson and R. Hancox, "*Choice of Materials and Problems of Design of Heavy Current Toroidal Discharge Tubes*," Proc. IEE (London) 106A, Suppl. 2, 47 (1959). It seems unlikely that the methods described in this paper, which is concerned with pulsed fusion systems, could be applied to the unipolar arcs in 3M2. On the other hand, a method that is not available in fusion systems is applicable to inductively coupled r.f. plasmas, namely: the direct control of the plasma floating potential $V_f$, which is the subject of the present invention.

OBJECTS OF THE INVENTION

It is an object of the invention to provide a method of eliminating deleterious and uncontrolled unipolar arcs in a metal-walled plasma chamber during deposition.

Another object of the invention is to provide an apparatus for emitting a controlled unipolar arc into the metal-walled plasma, thereby minimizing the introduction of impurities into the plasma during CVD due to uncontrolled unipolar arcs.

SUMMARY OF THE INVENTION

These and other objects of the invention which will become apparent hereinafter are achieved by introducing a filament made of a refractory metal, such as tantalum or tungsten, into a metal-walled plasma chamber, and heating the filament to produce a thermionic emission from the surface of the filament into the plasma. This emission results in controlled unipolar arcing at the wall of the plasma chamber. The filament is heated to a predetermined temperature by a combination of heat input from the plasma and resistive heating by passing a current through the filament from a power source.

DETAILED DESCRIPTION OF THE INVENTION

Figure 1:
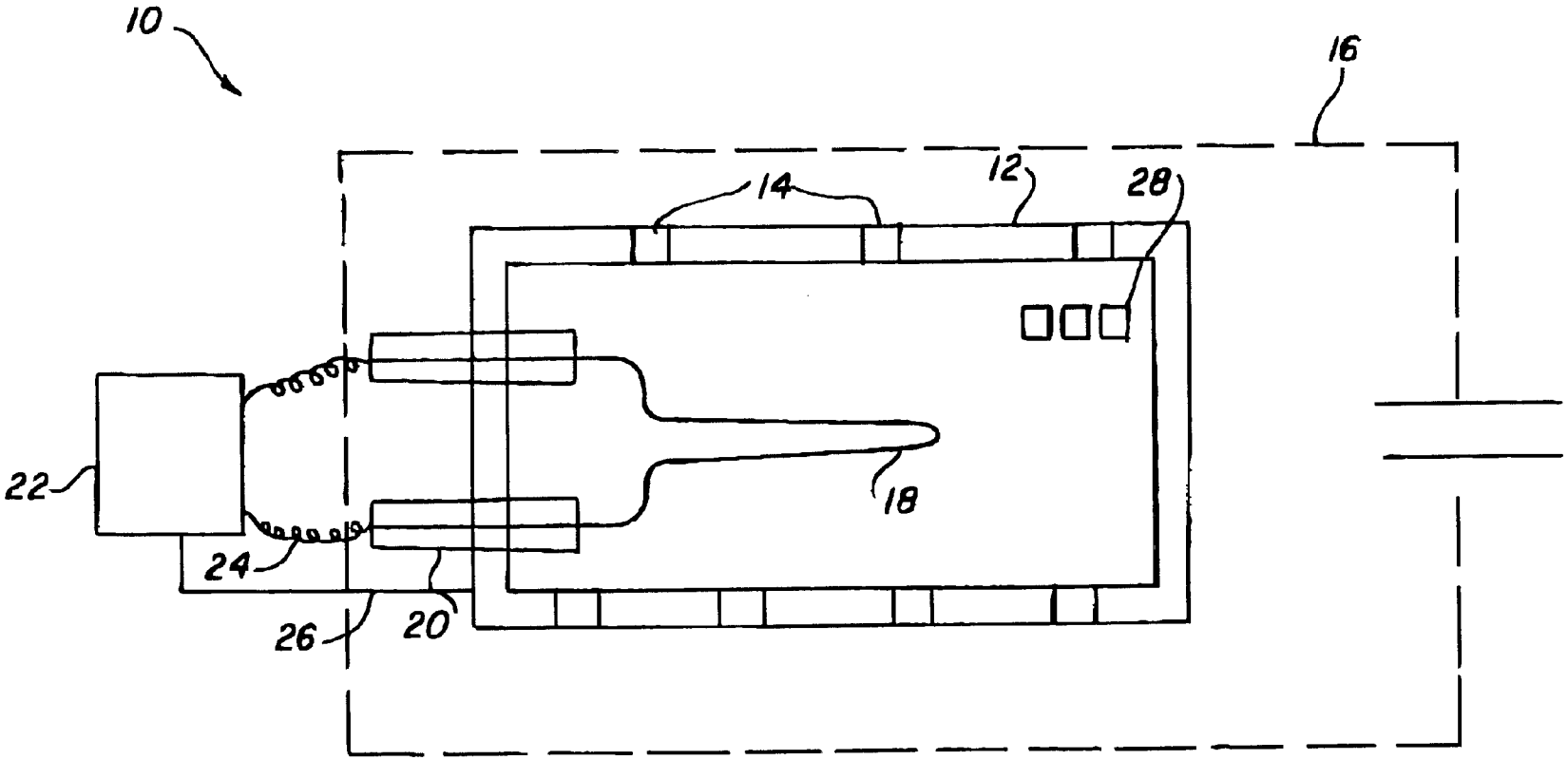
FIG. 1, the sole drawing figure, is a schematic, cross-sectional side view of a slotted, metal-walled plasma chamber equipped with a filament and heater, in accordance with the invention.

In order to understand the present invention, it is useful to consider certain physical properties of a plasma which develops in a metal-walled chamber. Thus the floating potential $V_f$, as defined herein above, arises because the electrons in a plasma have greater velocity than the ions, and tend to leave the plasma with a net negative charge. As is also described herein above, a high $V_f$ can result in arcing at the chamber wall, causing the above mentioned contamination problem. $V_f$ accelerates ions to the wall but retards all but the fastest electrons in the generally Maxwellian distribution, so that in the steady state the current of ions and the current of electrons leaving the plasma are equal. If a current $I_e$ of electrons is introduced into the plasma from an independent source, the requirement for quasi-neutrality of the plasma will dictate that there should be a net electron current Ie to the chamber walls and the floating potential reduces itself automatically to achieve this. If the total ion current to the wall (which in the steady state is equal to the total electron current to the wall) is Ii the analysis in Robson and Thonemann (loc. cit) can be used to obtain:

$$1n(1I_e/I_i)=(1-V/V_f)(1n(m_i/2\pi\ m_e)/2)$$

where V is the new plasma wall potential when an electron current $I_e$ is introduced into the plasma and $V_f$ is the potential in the absence of electron injection.

For a water plasma we have:

$$1n(1+I_e/I_i)=4.31(1-V/V_f)$$

while for a hydrogen plasma:

$$1n(1+Ie/I_i)=2.84(1-V/V_f).$$

For example, it is found from numerical simulations that in a reactor running at 100 kW about 1% of the energy is conveyed to the chamber walls by the kinetic and ionization energy of the ions ($eV_f+eV_i$). Typically, $V_f+V_i\approx 20$ eV, so we may estimate $I_i\approx 50$ A. In a water plasma with $T_e=2$ eV we have $V_f=8.6$ V. To reduce this to, for example, 5 V (at which unipolar arcs would almost certainly not exist) we require $I_e\approx 250$ A.

In a hydrogen plasma with $T_e=2$ eV we have $V_f=5.68$ V and to reduce this to, for example, 4.5 V, we require $I_e\approx 40$ A.

Referring now to FIG. 1, the sole drawing figure, a chemical vapor deposition apparatus, made in accordance with the invention, is illustrated, generally designated by the numeral 10. CVD apparatus 10 comprises a metal-walled chamber 12 which is provided with a plurality of slots 14. Slots 14 run between the interior and exterior surfaces of chamber 10. An r. f. application coil 16 is wrapped around chamber 12. A plasma is produced inside chamber 12, due to currents in coil 16, as detailed herein above. A number of removable substrates 28 are disposed at the interior wall of chamber 12, to receive the deposited material, in the present case, a diamond material.

The plasma inside chamber 12 is subject to unipolar arcing, at the inside surface of metal-walled chamber 12. Filament or strip 18 is provided extending into the interior of chamber 12 to eliminate the unipolar arcing. Filament 18 is made from a refractory metal, such as tungsten or tantalum. Filament 18 passes through the wall of chamber 12 by means of insulted feed through 20 and is connected by leads 24 to a heating power supply 22. To complete the circuit, heating supply 22 is connected through line 26 to chamber 12.

For example, in operation of the above described apparatus, specific parameters are seen as follows: to inject a current of 50–200 A into the 1000 kW plasma, filament 18 is introduced into the plasma and heated to about 2800 K by a combination of heat input from the plasma and resistive heating by passing a current through it from external power source 22. At this temperature, the thermionic emission from a tantalum surface is, theoretically about 20 A/cm2. A more conservative estimate of current density is 10 A/cm$^2$. The required area of the tantalum strip is then 5–20 cm$^2$. The black-body radiation from the surface, which determines the power required to heat the strip, is about 150 W/cm$^2$, for a total of 750–3,000 W.

The emitting strip is connected electrically by line 26 to the wall of chamber 12 and the electron current from the strip 18 passes through the plasma and returns to the wall. The emitting strip 18 thus acts like a controlled unipolar arc. Further details are available in Robson and Thonemann (loc. cit). However, it is necessary to consider that the electron emission from hot tantalum is accompanied by negligible evaporation of the material, whereas the cathode spot of a unipolar arc on a cold metal surface is a copious source of evaporated aluminum.

It will be appreciated that the described apparatus is extremely flexible in its design.

For example, a variety of filament material is possible, as well a variety of plasma chamber designs.

For these reasons, inter alia, will be appreciated that while preferred embodiments of the invention have been illustrated and described in detail herein, changes and additions may be had therein and thereto without departing from the spirit of the invention. Reference should, accordingly, be had to the appended claim in determining the true scope of the invention.

I claim:

1. Apparatus for controlling the potential of a plasma including a metal-walled chamber having an interior and an exterior, and a conductive coil adapted to carry a radio-frequency current wrapped around the metal-walled chamber to produce a plasma within said chamber; comprising:

a filament made of refractory metal and having a first end, a second end, and a central portion formed in the shape of a probe, said central portion of the filament extending into the interior of the chamber and said first and second ends of the filament passing through a wall of the chamber to the exterior of the chamber; and a heating power supply connected to said first and second ends of the filament and to the chamber wall for heating said filament to a predetermined temperature above that of the plasma, producing thermionic emissions from the filament to the plasma.

* * * * *